US006170035B1

(12) United States Patent
Gianellini et al.

(10) Patent No.: US 6,170,035 B1
(45) Date of Patent: Jan. 2, 2001

(54) DYNAMIC RANDOM ACCESS MEMORY (DRAM) HAVING VARIABLE CONFIGURATION FOR DATA PROCESSING SYSTEM AND CORRESPONDING EXPANSION SUPPORT FOR THE INTERLEAVED-BLOCK CONFIGURATION THEREOF

(75) Inventors: Marco Gianellini, Milan; Angelo Lazzari, Pavia, both of (IT)

(73) Assignee: Bull HN Information Systems Italia S.p.A., Pregnana Milanese (IT)

( * ) Notice: Under 35 U.S.C. 154(b), the term of this patent shall be extended for 0 days.

(21) Appl. No.: 09/080,991

(22) Filed: May 19, 1998

(30) Foreign Application Priority Data

May 20, 1997 (EP) .................................................. 97830231

(51) Int. Cl.⁷ .................................................... G06F 12/00
(52) U.S. Cl. ..................................... 711/5; 711/105; 711/2
(58) Field of Search ................................ 365/52, 230.04; 711/172, 157, 2, 5, 105, 115; 361/633, 748

(56) References Cited

U.S. PATENT DOCUMENTS

| Re. 36,325 | * | 10/1999 | Corbett et al. ........................ 257/685 |
| 5,214,570 | | 5/1993 | Shah et al. . |
| 5,272,664 | | 12/1993 | Alexander et al. . |
| 5,524,232 | * | 6/1996 | Hajeer ................................ 711/115 |
| 5,579,277 | | 11/1996 | Kelly . |
| 5,604,871 | * | 2/1997 | Pecone ................................ 710/101 |
| 5,809,555 | * | 9/1998 | Hobson ................................ 711/172 |
| 5,951,665 | * | 9/1999 | Crane, Jr. et al. .................... 710/126 |
| 5,963,464 | * | 10/1999 | Dell et al. ........................... 365/52 |
| 6,004,139 | * | 12/1999 | Dramstad et al. ..................... 439/59 |
| 6,034,878 | * | 3/2000 | Osaka et al. ......................... 365/52 |
| 6,094,355 | * | 7/2000 | Vakilian ............................. 361/761 |

FOREIGN PATENT DOCUMENTS 0 398 188 A2 11/1990 (EP) .
0 571 092 A2 11/1993 (EP) .

* cited by examiner

Primary Examiner—John W. Cabeca
Assistant Examiner—Pierre-Michel Bataille
(74) Attorney, Agent, or Firm—Akin, Gump, Strauss, Hauer & Feld, L.L.P.

(57) ABSTRACT

Dynamic random access memory with variable configuration depending on the number and capacity of standard memory modules, of DIMM type plugged into a first plurality of slots of a memory motherboard comprising a control unit, into which it is possible to plug, into the first plurality of slots, in substitution for the memory modules, expansion supports, in turn provided with a second plurality of slots for the insertion of standard memory modules of DIMM type, and of column address latch registers each associated with a slot of the second plurality and thereby to support and allow the configurability and operability of interleaved-block memory, and access cycles, with partial time overlap, without renouncing the use of commercially available DIMM memory modules and without burdening the basic memory configuration with all the overheads required to support the interleaved-block configuration.

8 Claims, 4 Drawing Sheets

DYNAMIC RANDOM ACCESS MEMORY (DRAM) HAVING VARIABLE CONFIGURATION FOR DATA PROCESSING SYSTEM AND CORRESPONDING EXPANSION SUPPORT FOR THE INTERLEAVED-BLOCK CONFIGURATION THEREOF

CROSS REFERENCE TO RELATED APPLICATIONS

This application claims the benefit of EPO Application No. 97830231.3 filed May 20, 1997.

1. Technical Field

The present invention relates to a dynamic random access memory (DRAM) for data processing system. The memory can have a variable configuration depending on user requirements, and a capacity which is expandable through non-interleaved memory modules or through interleaved memory blocks, possibly spread over several expansion supports. It also relates to the corresponding expansion support or Memory Riser with which the interleaved memory blocks are made, possibly spread over several supports.

2. Background of the Invention

It is known that in order to meet the various requirements of use of data processing systems, the latter are provided with a random access work memory, of dynamic type (DRAM), whose capacity can be expanded.

A broad example consists of the PCs in which on a motherboard, on which the microprocessor and a memory control unit are installed, is also installed a plurality of connection slots into each of which can be inserted a memory module, of the type commercially available with the acronyms SIMM (Single In Line Memory Module) and DIMM (Dual In Line Memory Module).

These memory modules are essentially small printed circuit boards which, on an edge connector, bear connection terminals and on which board are mounted as many integrated memory components as are necessary to allow the desired memory parallelism.

These modules have in fact become, from the commercial and technological point of view, a standard and with advances in technology have made available modules with ever-growing capacity, at a factor $2^N$ relative to a base capacity.

Thus by installing one or more modules in the various available slots (an operation which with the due precautions can even be carried out by the user) it is possible to provide a memory whose capacity can be expanded, as a function of the various user requirements, without burdening the basic product with the cost of a memory having the maximum capacity allowed by the system.

In more advanced systems, memory modules of a certain type can also be substituted by others having a greater capacity, double or quadruple that originally installed.

Thus the connection interface, at slot level, has been defined to allow this possibility and contains a number of address terminals which is suitable for the maximum envisagable (even in view of further technological developments) capacity of the modules.

The interface also provides a suitable number of identification terminals for the transfer, from the module to the system, of signals which make it possible to recognize the type of module and its capacity and hence to configure, by means of configuration logic of the memory control unit, the working memory, in such a way as to address the whole of the available memory space and select in rotation, through read and/or write operations, one of the modules which make up the memory.

The SIMM or DIMM modules (the latter differ from the former through their greater memory capacity, obtained by installing components on both faces of a printed circuit support) therefore make up the memory units installable in the system.

In high-performance data processing systems, generally consisting of a plurality of processors, varying in number depending on requirements, which have access to a shared working memory, it is not sufficient to employ a working memory of large capacity: it is also necessary for several read and/or write operations to be carried out in the working memory with at least partial time overlap, so as to increase the memory throughput.

This is achieved by constructing the memory as a plurality of banks or blocks which can be controlled and addressed independently and amongst which the memory space is divided up according to well known concepts of "interleaving".

A memory bank or block is therefore defined as the minimum memory unit which can be interleaved.

Configuration logic, which depending on the memory address identifies the block to be used for the read/write operation, is not sufficient to allow memory interleaving: control logic which supplies the necessary timed commands and a latch register which retains the memory address, intended for the block, for the whole of the required time, must also be provided for each block.

Two partitioning approaches are possible in order to produce a memory architecture with interleaved blocks: according to a first approach a motherboard which contains the memory control unit, interfaced with a system bus, also contains all of the control and timing logic and the registers required to drive a maximum number, envisaged by design, of memory blocks.

The memory blocks can consist of one or more memory modules of standard type, for example SIMM or DIMM, mounted on the motherboard via connectors.

With this approach the basic structure of the system is burdened by significant costs for the logic required to manage the maximum memory configuration even when the configuration actually required by the user is smaller on account of memory capacity and level of interleaving required.

With a second approach the various blocks consist of printed circuit daughterboards on which are mounted, in addition to the memory components (possibly varying in number in order to produce various capacities) also the necessary management and timing logic for the block as a component of an interleaved memory structure.

The daughterboards are then each inserted, in varying number depending on the requirements, into various slots of the motherboard.

Upon the control unit on the motherboard devolves the sole task, by means of the memory configuration logic and depending on the memory address, of selecting, from among the various blocks present in memory, that upon which the read/write operation devolves.

With this approach the basic structure of the system is not burdened by the costs of the logic necessary to manage the maximum configuration, but, even when an interleaved memory structure is not required, it is still necessary to employ a memory block, and it is not possible to use instead a standard memory module of SIMM or DIMM type which is more readily obtainable on the market and less expensive.

A further limitation of this approach is that the level of interleaving is closely dependent on the number of blocks installed and hence, to some extent, also on the capacity installed.

A problem common to expandable DRAM memories, be they structured as interleaved blocks or as simple modules, therefore consists in the fact that many signals, and in particular the address signals, have to be sent to a widely varying number of loads.

It is therefore necessary to provide, in order to prevent degradation of the signal edges and erroneous recognitions thereof, in particular if. the memory operation is timed by clock signals of high frequency of the order of 100–150 MHz, as is now current practice, drive buffers, according to a tree structure if arranged at several levels.

These buffers, although on the one hand preventing the degradation of the signal edges, on the other hand introduce propagation delays which have to be taken into account in the mutual timing of the signals and however allocated, on the motherboard or in the memory blocks, they indiscriminately increase the memory access time irrespective of the memory configuration actually present.

Thus, the worst timing case should be considered.

SUMMARY OF THE INVENTION

These limitations and drawbacks are eliminated from the dynamic random access memory which is the subject of the present invention which provides for the use of memory modules of DIMM type inserted directly into slots in a motherboard, varying in number, to obtain a memory configuration with varying capacity depending on the number and type of modules installed, and also the alternative or combined use of printed circuit expansion supports which, these too, are inserted into the same slots in the motherboard, envisaged for the DIMM modules, and which in turn are provided with slots for the insertion of a number of DIMM modules varying from one to a maximum, preferably of six.

The expansion supports are also provided with buffers for address signals and with a plurality of latch registers for retaining (column) addresses however many DIMM modules can be installed in the support.

Via the slots in the motherboard, the memory control unit sends, to the various expansion supports, pairs of timing and selection signals RAS, CAS, selectively directed to one of the expansion supports and, within the compass of the support, to one of the various DIMM modules installed therein. It also sends a read/write (WE) command and a column address latch command (ALE), which are selectively directed to one of the various DIMM modules installed in the supports.

The selective generation of the various signals is determined by a memory configuration logic known per se.

In this way the memory capacity car be expanded through the use of several non-interleaved DIMM modules connected directly to the slots of the motherboard, as well as by the use of one or more expansion supports which allow the structuring of the memory as interleaved blocks.

The use of a single expansion support is sufficient for structuring as interleaved blocks.

The joint use of several expansion supports makes it possible to obtain interleaved blocks of greater capacity, dispersed among various supports, and still obtained through the use of DIMM memory modules of standard type.

In this way an extremely versatile memory structure is obtained, which can be expanded with a very fine granularity, imposed by the minimum commercially available capacity of DIMM modules up to extremely high capacities, of the order of G bytes, achieved through the use of expansion supports and DIMM modules with the maximum commercially available capacity.

All of this is obtained without burdening the basic structure with all the costs associated with the supporting logic circuits which allow memory operation in interleaved mode. The configuration logic is thus not to be regarded as support logic dedicated exclusively to the interleaved structure and the timing logic is itself also essential, to some extent, even for operation in non-interleaved mode.

According to a further aspect of the present invention, the expansion supports are provided with a terminal for sending to the memory control unit (via the connection slot) a signal indicative of expansion support present.

Depending on this signal the memory control unit may be able to optimize the memory access timing, depending on the presence or otherwise of the expansion support or supports so as to obtain, in every case, the maximum performance and also automatically to determine whether the memory can or cannot be configured as interleaved blocks. In addition to these functions it also has that of defining the meaning of certain signals generated by the memory modules, which is different in the case of non-interleaved and interleaved memory.

According to a further aspect of the present invention the data input/output channels for the various memory modules may also be provided with drive buffers, of the three-state type or the like, mounted on expansion supports. With this arrangement it is possible to control the data flow over the data channel much more accurately from the time viewpoint and to achieve greater overlap of the memory cycles of the various blocks operating in interleaved mode, thereby achieving a higher overall throughput and performance.

BRIEF DESCRIPTION OF THE DRAWINGS

The features and advantages of the present invention will emerge more clearly from the description which follows of a preferred embodiment given by way of non-limiting example with reference to the appended drawings in which.

DETAILED DESCRIPTION OF THE PREFERRED EMBODIMENTS

Figure 1:
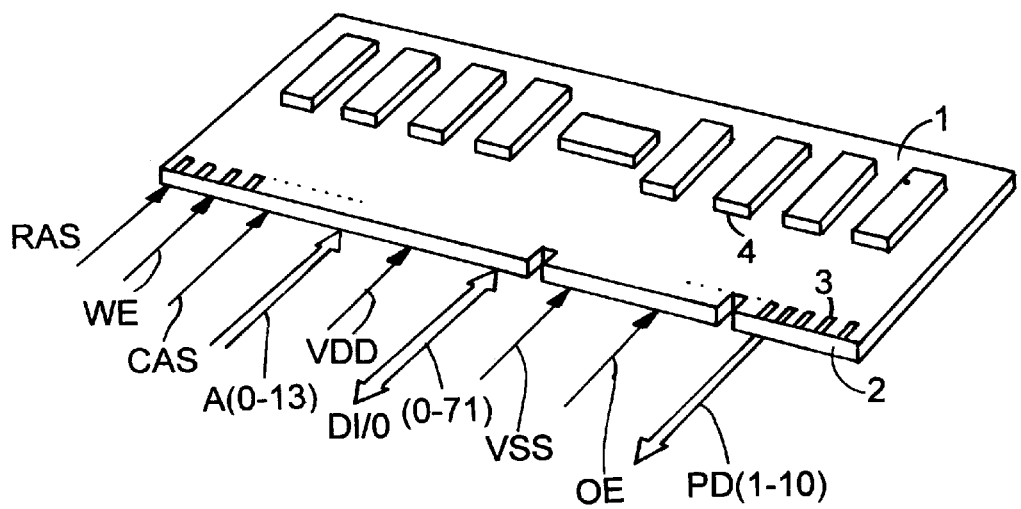
FIG. 1 represents a perspective view of a DIMM (or SIMM) memory module known per se.

For a better understanding of the invention, FIG. 1 represents a perspective diagrammatic view of a dynamic random access memory (DRAM) of DIMM type, commercially available.

The module consists of a printed circuit support 1, provided with an edge 2, for insertion into a connection slot.

Electrical terminals 3, numbering 64 per face, are formed on both faces of the support, along the edge.

Mounted on the printed circuit support is a plurality of memory components 4 which overall determine the capacity of the module and the memory parallelism.

Depending on the manufacturing technology, modules are available on the market today with a capacity of 1, 2, 4, 8, 16 Mega entries of 72 bits each (including 64 databits and 8 parity code bits or EDAC error detection and correction code bits).

The capacity expressed in data bytes is therefore 8, 16, 32, 64 and 128 Megabytes respectively.

For control and addressing of these modules, the electrical interconnection terminals of the modules comprise 14 address terminals A(0–13) (on which the address code, which overall requires from 22 to 24 bits, is transferred in two stages, as row address first followed by column address), an RAS terminal for receiving a row address validation command, a CAS terminal for receiving a column address validation command, a terminal WE for receiving a signal which, when true or asserted, characterizes the access operation as a write operation, 72 data terminals D1/0 (0–71), 10 terminals PD(1–10) for sending a code which makes it possible to identify the type and capacity of the module, and a suitable number of terminals VDD and VSS for powering the module via connection to a voltage VDD (typically +3.3V) and to earth (VSS).

The remaining terminals can be used for various functions. For example, in some DIMM modules one terminal (or two) denoted OE has the function of output-enabling the module with a timing which differs from that set intrinsically by the signals WE, RAS and CAS.

No module selection signal is provided at the input to the module: this function is fulfilled intrinsically by the assigning of the signals RAS, CAS.

Figure 2:
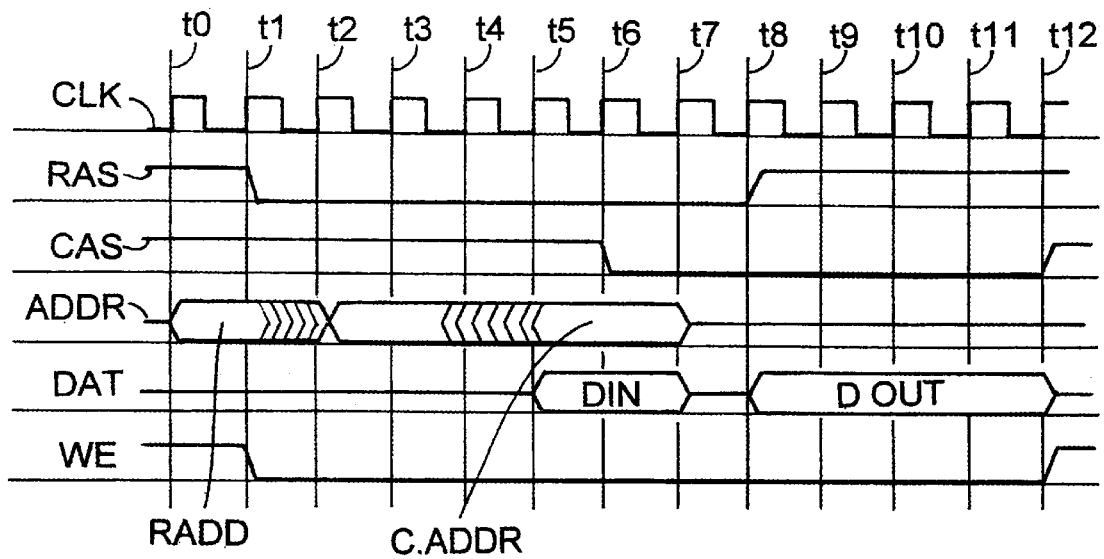
FIG. 2 represents a time chart depicting the operation of a memory module such as that of FIG. 1.

FIG. 2 represents by way of example, as a timing chart, the read operation for a DIMM memory module, referred to a periodic clock signal CLK, which again by way of example has a period of 10 ns.

Typically a DIMM module can operate in memory cycles with a duration of the order of 120 ns, with command signals RAS asserted (at electrical level 0) for a minimum duration of 70 ns and deasserted (precharge time) for a minimum duration of 50 ns.

A row address RADDR is input to the module at the instant t0 on the address channel ADDR, and the command RAS is asserted at the instant t1.

At the instant t2 the row address can be removed from the ADDR channel and substituted, within a time limit defined by the instant t5, by a column address CADDR.

In the case of a write operation (WE asserted in the memory cycle), the input datum DIN must also be placed on the data channel DAT.

The command CAS is asserted at the instant t6. The column address CADDR and any input datum can be removed from the respective channels ADDR, DAT at the instant t7.

At the instant t8 the signal RAS is deasserted and, if the memory access operation is a read, the module outputs the read data item DOUT on the data channel DAT.

At the instant t12 the command CAS is deasserted and the data outputs (of three-state type) of the module are closed (i.e. placed at high impedance).

Another memory cycle can begin at the instant t12.

Figure 3:
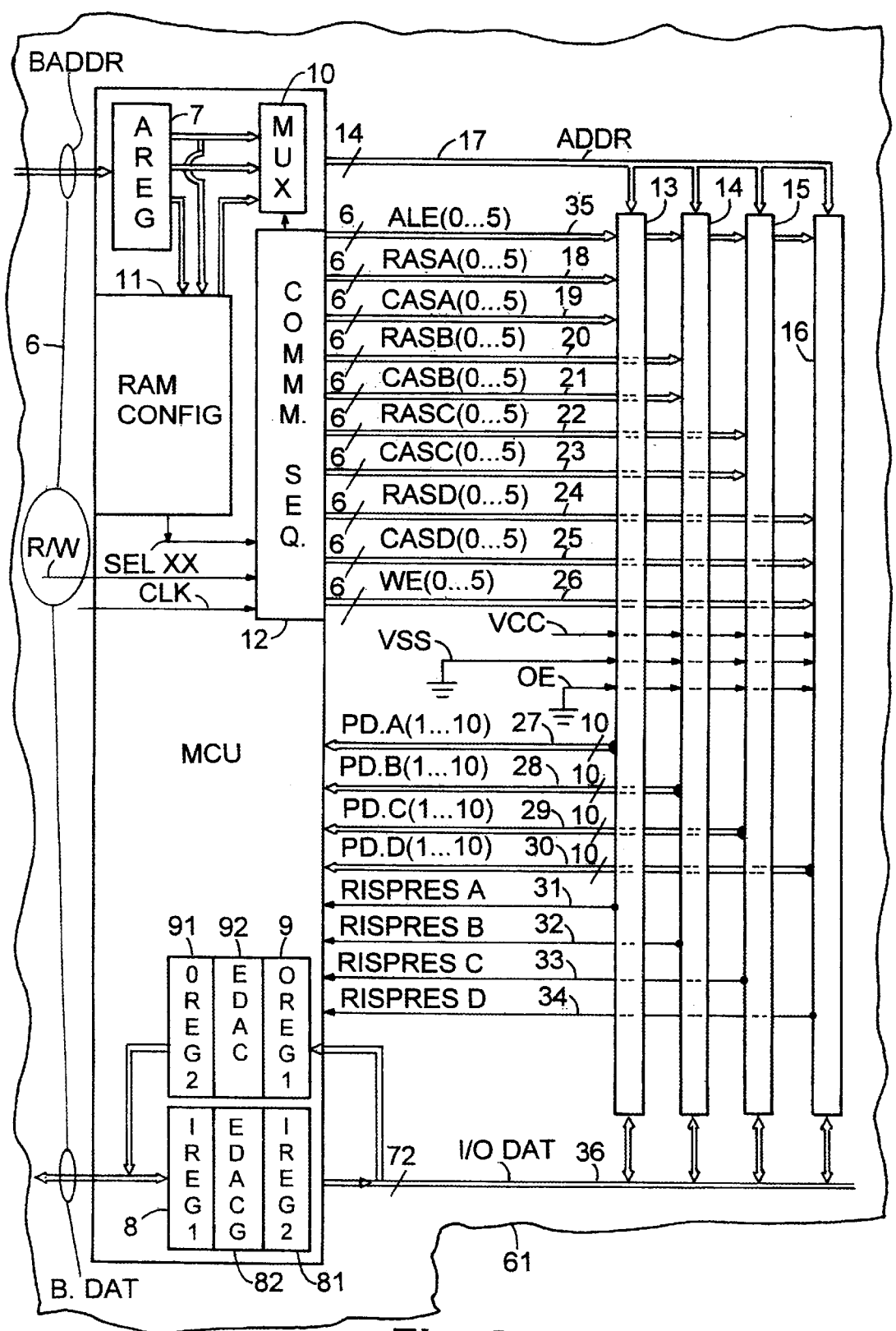
FIG. 3 represents a block diagram of a preferred embodiment of a DRAM memory with expandable capacity, configurable as interleaved blocks, in accordance with the present invention.

After this preamble it is possible to consider FIG. 3 which represents in diagrammatic block form a preferred embodiment of a dynamic memory architecture having a capacity which can be expanded through non-interleaved modules or through interleaved blocks, in accordance with the present invention.

FIG. 3 essentially represents a portion of main board or motherboard 61 of a data processing system (also known as a back panel or system planar) on which is mounted a memory control unit 5 or MCU, which interfaces with a system bus 6 in order to receive memory addresses BADDR a read write command R/W, any data to be written B DAT, if the operation to be executed is a write and to place the read data BDAT on the system bus, if the commanded operation is a read.

The memory control unit also receives a periodic clock signal CLK, for example with a period of 10 ns, from a timing unit (not shown). The memory control unit is provided with an address latch register 7 (AREG), with a pair of input data latch registers 8, 81 (IREG1, IREG2) arranged in cascade with the interposition of logic 82 (EDAC.G) for generating an error detection and correction code (or alternatively a parity code) and with a pair of output data latch registers 9, 91 (OREG1, OREG2) arranged in cascade with the interposition of logic 92 (EDAC) for error detection and correction (or even for error detection alone).

The memory control unit also comprises an address multiplexer 10, memory configuration logic RAM CONFIG 11 and command sequence and timing logic 12 (COMM.SEQ.).

By suitable procedures known per se, including those for automatic initialization, the system is able to identify the memory capacity installed in the system, possibly availing itself of signals generated by the various memory modules (and available at the terminals PD of the modules).

This information supplied to the logic 11 makes it possible to configure the memory.

On the basis of the configuration thus defined the configuration logic 11, timed by the clock signal CLK, instructs the multiplexer 10 to output in successive stages, first a row address, comprising a certain number of address bits stored in the register 7, followed by a column address, comprising other address bits also stored in the register 7 and further address bits generated by the configuration logic 11, depending on the memory configuration defined and on the address present in the register 7.

The configuration logic also outputs a plurality of selection signals SELXX, one at a time, which select the various memory modules in which to execute the read/write operation.

All these aspects are known and lie outside the scope of the invention.

Patent application EP-A-0629952 provides for example a detailed description of a memory control unit with configuration logic which allows optimal configuration of the interleaving level, depending on the number and capacity (even where different from module to module) of the modules installed.

The module selection signals SELXX, generated by the configuration logic, are not applied directly to the various modules but in turn activate the command timing logic 12 or command sequencer (consisting essentially of N state machines where N is the maximum level of interleaving) for the generation of the timed commands for activating the various modules RAS, CAS, WE.

The memory control unit 5 interfaces with a plurality of DIMM module connection slots 13, 14, 15, 16, preferably but not necessarily four in number, via a plurality of wires:

An address output channel ADDR 17 (with 14 wires) connects the outputs of the multiplexer 10 to the terminals of the slots 13, 14, 15, 16 which connect to the terminals of the DIMM modules provided for receiving a row and column address bit.

A channel 18 with N wires (in the example N=6) connects N outputs from the command sequencer 12 to N terminals of the slot 13 alone, in order to apply signals RAS.A(0 . . . 5) to the slot N.

In particular the signal RAS.A0 is applied to the slot terminal which is connected to the terminal of a DIMM module provided for receiving the row address validation command RAS, whilst the signals RAS.A(1 . . . 5) are applied to slot terminals which are connected to unused terminals by a DIMM module plugged into the slot.

In the same way a channel 19 with N wires (in the example N=6) connects N outputs of the command sequencer 12 to N terminals of the slot 13 alone so as to apply signals CAS.A(0 . . . 5) to the slot N.

In this case also the signal CAS.AO is applied to the slot terminal which is connected to the terminal of a DIMM module provided for receiving the row address validation command CAS, whilst the signals CAS.A(1 . . . 5) are applied to slot terminals which are connected to unused terminals by a DIMM module plugged into the slot.

Entirely similar is the connection of the pairs of channels, with six wires each, 20, 21, 22 and 23, 24 and 25, respectively to the slots 14, 15, 16 for transferring signals RAS.B(0 . . . 5) CAS.B(0 . . . 5), RAS.C(0 . . . 5), RAS.D(0 . . . 5), CAS.D(0 . . . 5) to the slots.

Again at the output of the command sequencer 12 a channel 26 with N wires is connected to N terminals of all the slots 13, 14, 15, 16 for transferring write commands WE(0–5).

The command WE0 is applied to a terminal of the various slots which is connected to a DIMM module terminal intended to receive the write signal WE. The other commands We(1–5) are applied to slot terminals which are connected to unused terminals of a DIMM module.

Neglecting the obvious connection of predetermined terminals of the slots 13, 14, 15, 16 to a voltage source Vcc, to a reference or earth voltage Vss, it will be noted that four channels with 10 wires 27, 28, 29, 30 each connect 10 slot terminals, 13, 14, 15, 16 respectively, intended for connection to the DIMM module terminals on which a module identification code PD is present, to the memory control unit 5 in order to transfer thereto the codes PDA(1–10), PDB (1–10), PDC(1–10), PDD(1–10) respectively for identifying the various modules which may be installed in the various slots. In practice, in the case of DIMM modules installed directly into the slots, only bits 1–4 are actually used, since they define the variable capacity of the module.

The other bits from 5 to 10 define characteristics of the modules, such as the access time, the presence or otherwise of memory cells dedicated to check bits and their function (parity bit or EDAC code).

As these may be regarded as application-invariant characteristics, the bits PD(5–10) can be used, as will be seen later, for other purposes.

In addition to these channels, four wires are present for the connection of a terminal, respectively of the slots 13, 14, 15, 16, which is connected to an unused terminal of a DIMM module installed in the slot, to the memory control unit 5 (or more generally to the system) for sending the latter signals RISPRES A,B,C,D, indicative of the presence in the various slots of an expansion support or Memory Riser in substitution for a DIMM module.

The electrical connections between memory control unit 5 and slots 13, 14, 15, 16 are completed by a channel 35 with N wires for transferring, from the command sequencer 12 to terminals of all the slots which are connected to unused terminals of the DIMM modules installed in the slots, column address latch commands ALE(O . . . 5).

These commands, as we shall see, are used by the memory expansion supports if present.

Finally, in the conventional manner, a databus 36 with 72 wires connects the terminals of all the connectors, intended to be connected to data terminals of the DIMM modules installed therein, to the outputs of the IREG2 register 81 and the inputs of the OREG1 register 9.

It is therefore evident that with this architecture it is possible to install up to four DIMM modules of like or unlike capacity directly into the slots, producing a memory with capacity expandable from 8 Mbytes to 512 Mbytes (with few exceptions in increments of just 8 Mbytes) as a function of the capacity of the modules installed.

The various modules installed cannot operate in interleaved mode since the control unit is not provided with the necessary "buffers" for supporting the interleaved mode of operation.

In return the number of logic components required to make the memory control unit is reduced to the minimum, offering the possibility of converting the memory structure, at a modest added cost into a bank structure able to operate in interleaved mode, with a variable level of interleaving dependent on the number of banks installed and with capacity which can be expanded well beyond the limit first indicated.

Figure 4:
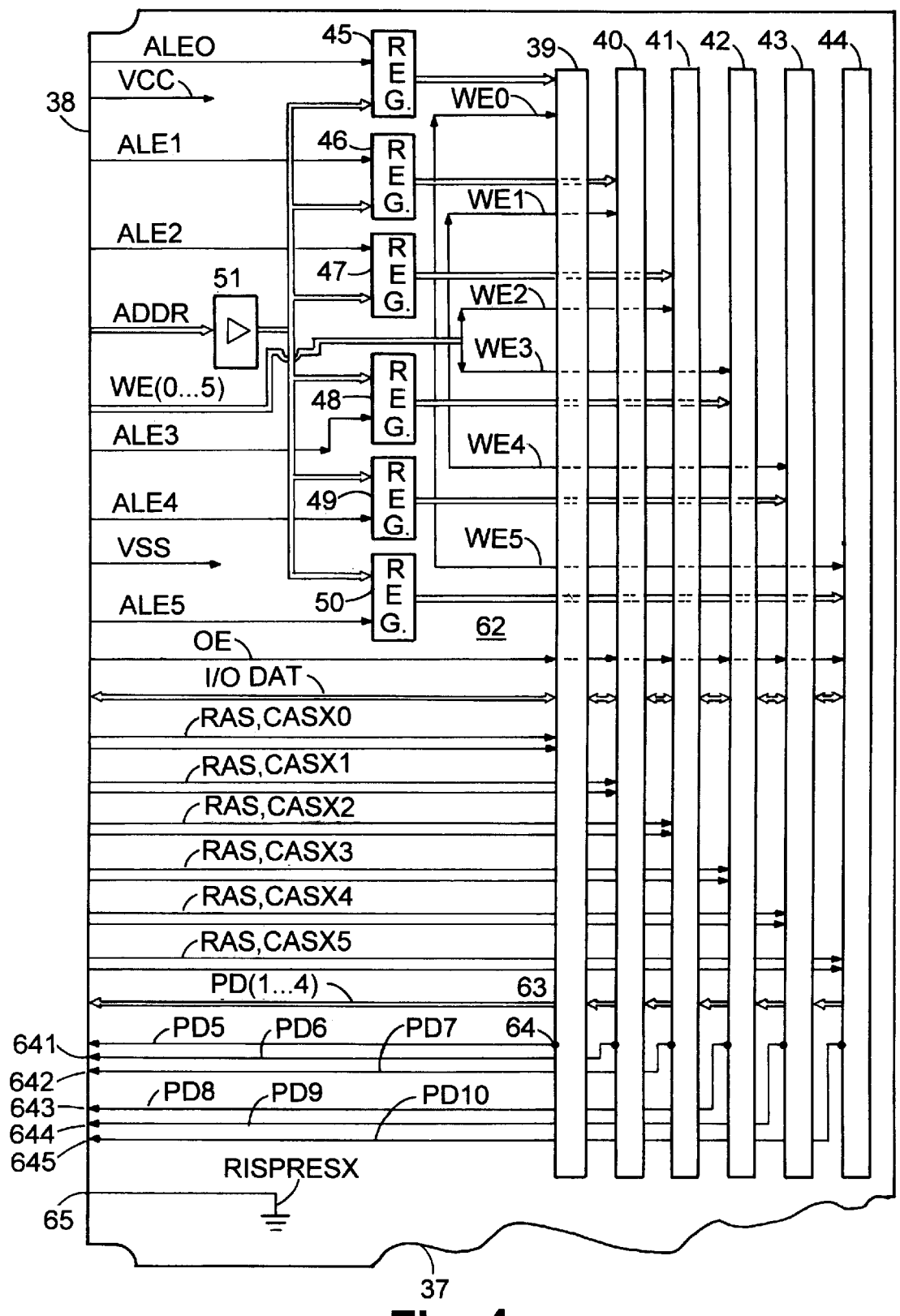
FIG. 4 represents a block diagram of a preferred embodiment of an expansion support for the memory of FIG. 3 and its configurability through interleaved blocks.

For this purpose, expansion supports, the structure of which is represented in FIG. 4, can be installed in the slots 13, 14, 15, 16 of FIG. 3, in substitution for the DIMM modules.

With reference to FIG. 4 an expansion support, or Memory Riser, collectively identified by the numeral 62, consists of a printed circuit daughterboard 37 with an edge connector 38 for insertion into a connection slot such as 13, 14, 15, 16 of FIG. 3.

Mounted on the printed circuit daughterboard is a plurality of N connection slots (in the preferred embodiment N=6) 39, 40, 41, 42, 43, 44, for plugging in as many DIMM modules, an equal number of latch registers 45, 46, 47, 48, 49, 50 and a plurality of drive elements 51 (available as a single integrated circuit).

All the necessary connections are made on the printed circuit board 37, of the multilayer type.

The row and column addresses received through the edge connector are applied as input to the drivers 51 and transferred therefrom as input to all the latch registers 45 . . . 50.

The registers 45 . . . 50 are controlled respectively by the signals ALE 0, 1, 2, 3, 4, 5, when assigned, received through the edge connector.

The outputs of the registers 45 . . . 50 are connected respectively to the terminals of the slots 39, . . . 44 which are connected to the address terminals of DIMM modules plugged into the slots.

The signals RAS.XX, CAS.XX, the first index X (X=A, B, C, D) identifying the expansion support represented in the figure (one of four supports which can be inserted into the slots 13, 14, 15, 16 of FIG. 3) and the second index 0, 1, . . . 5 indicating one of the slots 39, . . . 45 and a corresponding DIMM module installed therein, are selectively distributed from the edge connector to the terminals of the various slots 39, . . . 44 intended to be connected to the terminals of the DIMM modules installed therein, provided for receiving the signals PAS, CAS.

The homologous terminals 63 of the various slots, which are connected to the terminals of DIMM modules installed therein, on which are present the module capacity identification signals PD(1–4) (asserted when at electrical level 0) are connected together so as to present on the edge connector a code PD(1–4) which is the logical OR of the various codes representative of the capacity of the modules installed in the various slots.

A homologous terminal 64 of the various slots, which is connected to a terminal of a DIMM module installed therein, securely at logic level 1 (for example a terminal such as PD8 on which is present a module identification signal PD at logic 1 in order to define that an EDAC code is associated with the data stored) is connected respectively to a distinct terminal 640, 641, 642, 643, 644, 645 of the edge connector 38 in order to transfer a signal PD5, PD6, PD7, PD8, PD9, PD10 respectively indicative, when assigned, of the presence of a module in the slot.

Finally a terminal 65 of the edge connector 38, homologous to an unused module terminal, is connected permanently to earth so as to send an assigned signal RISPPESX (X=A,B,C,D) to the memory control unit, when the expansion support is installed in one of the slots 13, 14, 15, 16 of FIG. 3.

Considering jointly FIGS. 3 and 4 it is therefore evident that by installing one or more expansion supports such as that of FIG. 4 into the slots 13, 14, 15, 16, and by installing one or more DIMM modules into the slots of the various expansion supports, it is possible to expand the memory capacity at will, up to a maximum of 3 Gbytes, employing the maximum installable number of expansion supports (4) and DIMM modules (24) each with the maximum envisaged capacity of 128 Mbytes.

Moreover, as the expansion supports are provided, for each module installable therein, with a column address storage latch register, the memory modules installed on the expansion support can operate as interleaved memory blocks.

The maximum number of blocks which can be obtained, in the example described with the installation of merely a single expansion support, is equal to six and makes it possible to obtain interleaving levels equal to two or four.

The capacity of the blocks is determined by the capacity of the DIMM modules installed in the expansion support, which capacity may differ from module to module.

Employing additional expansion supports over and above a first, up to a maximum of four, makes it possible to further expand the capacity of the blocks which are thereby dispersed over various supports.

In the embodiment described the DIMM modules installed on different expansion supports cannot be configured as distinct blocks since, as should be noted, the signals ALE(0–5) and WE(0–5), generated by the command sequencer, are distributed indiscriminately to all the supports.

Unlike the signals RAS, CAS which are dispersed selectively and individually in a one-to-one manner to the various modules, the signals ALE and WE are distributed selectively in a one-to-one manner to the various blocks and, within the compass of each of the blocks, to all the modules which make up the block and which may be dispersed over several supports.

It is conceptually possible, given that each expansion support is provided with latch registers, one for each DIMM module installable in the support, to produce a memory configuration with interleaved blocks in which each module constitutes a block.

This would however require the selective transfer to the various supports of, in addition to the signals RAS, CAS, also the signals ALE(0–5) and WE(0–5), employing a number of slot terminals, which are not available since they are used for other purposes.

This limitation is less constraining if the expansion supports are envisaged as receiving less than 6 DIMM modules, for example 4.

In this case, 8 terminals (2 ALE terminals, 2 RAS terminals, 2 CAS terminals and 2 PD terminals) are made available for (he selective transfer of the signals ALE and WE to pairs of expansion supports, and it is possible to configure the memory as consisting of 8 interleaved banks, as against the six previously.

The maximum installable memory capacity is however reduced from 3 Gbytes to 2 Gbytes.

Evidently the memory configuration, with interleaved blocks, if only through the presence of an expansion support, excludes the use of DIMM modules installed directly in the slots of the motherboard or system planar.

This is because the need to maintain the column address on the address channel 17 (FIG. 3) in support of an operation of access to these modules, precludes the possibility of addressing another module in the same time interval.

Figure 5:
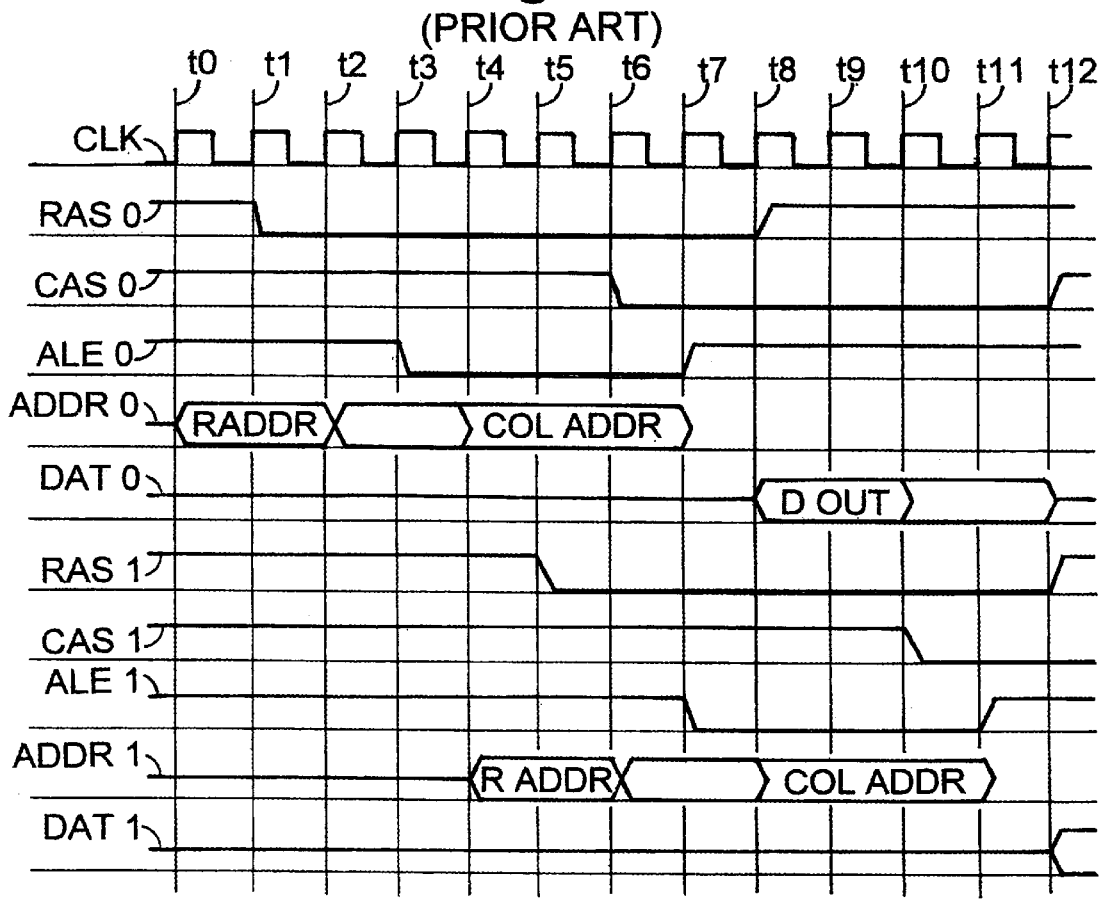
FIG. 5 represents a time chart depicting the operation of the memory of FIG. 3, configured through interleaved blocks.

FIG. 5 represents by way of example a time chart of the operation of a pair of interleaved blocks of the memory described, when configured in blocks.

For simplicity, the case of read operations alone is considered so as to avoid a discussion of the problem of possible interference in access to the data channel which is common for the input and output data.

This problem is resolved in a known manner by the memory control unit which also operates as arbiter of access to the data channel, deferring a write operation if the occupation of the data channel 36 (FIG. 3) by data read is envisaged in the same time interval.

The charts RAS0, CAS0, ALE0, ADDR0, DAT0, represent the signals of the same name, referred to a generic block of index 0, the charts RAS1, CAS1, ALE1, ADDR1, DAT1, represent the signals of the same name referred to a second block of index 1.

With reference to the periodic clock signal CLK, it will be noted that the transitions of the signals RAS0, CAS0 take place at the same time instants considered in FIG. 2.

Should however the delay of one clock period not be sufficient to recover the propagation times of the address signals in the drive circuits 51 and in the latch register (one of the registers 45, 50 of FIG. 4), the assertion and deassertion of the signals RAS and CAS can be deferred by a whole period of the clock signal (or by a fraction thereof).

The deferment can be set automatically as a consequence of recognizing the expansion support present, consequent on the signal RISPRES asserted.

The only difference in behaviour relative to the time chart of FIG. 2 is the presence of the signal ALE, which is asserted from the instant t3 to the instant t7, so that the column address, present on the address channel 17 at the instant t3, is frozen in the latch register up to the instant t7 and can be removed from address channel 17 starting from the instant t4 or even t3.

Therefore, from the instant t4 another row address (chart ADDR1) relating to another memory block with index 1 can be placed on the address channel, and the signal RAS1 can be asserted at the instant t5.

A second memory read operation is then activated, executed in a block 1 different from the previous one, with the same relative timings as the first.

In the time interval t8–t12 the data item read in block 0 is present on the data channel and in the time interval t12–t16 the data item read in block 1 is present on the data channel.

It is clear that starting from the instant t8 a third read operation with another block can be activated, without interference with the previous ones, so that up to three memory blocks can be active simultaneously in the course of a memory read cycle.

Figure 6:
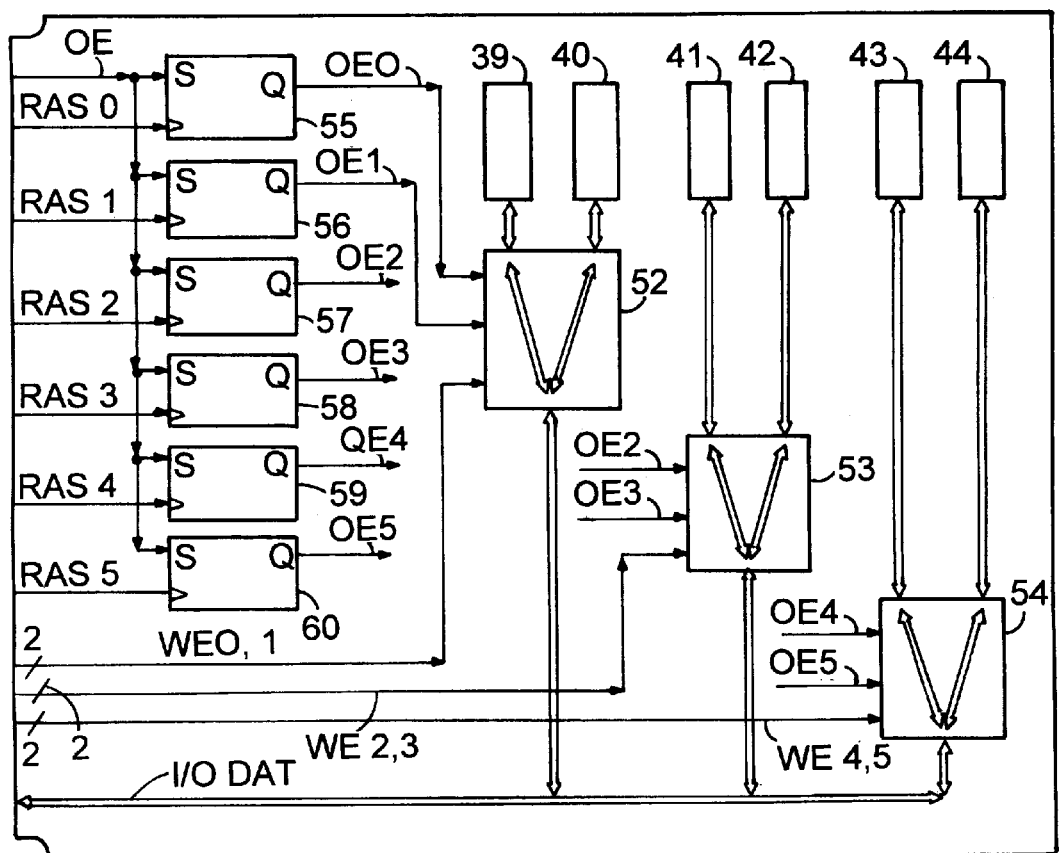
FIG. 6 represents a block diagram of a variant embodiment of the expansion support of FIG. 4.

FIG. 6 represents a variant embodiment of an expansion support which makes it possible to increase the memory throughput, allowing time overlap operation of four memory blocks.

Moreover, it offers the advantage of reducing the number of loads connected to the data channel so that the signal transitions are more abrupt and the signal levels can be more clearly discriminated even in a restricted time interval.

FIG. 6 is restricted to those aspects alone which differentiate the expansion support from that already presented and discussed with reference to FIG. 4.

In FIG. 6, a trio of tridirectional transmitter/receiver circuits (tridirectional transceivers) 52, 53, 54, and six control flip-flops 55; 56, 57, 58, 59, 60 are mounted on the printed circuit board 37 of the expansion support, in addition to the components and slots already seen.

The tridirectional transceiver 52 has two input/output ports connected respectively to the data input/output terminals of the slots 39, 40 and a third input/output port connected to the data channel I/ODAT of the expansion support.

Likewise, the tridirectional drivers 53, 54 have two input/output ports connected respectively to the data input/output terminals of the slots 41, 42, 43, 44 and a third port connected to the data channel I/ODAT of the expansion support.

The expansion support receives through the edge connector a signal OE which, rather than being permanently assigned, is assigned only for a restricted time interval, for example the third clock period following the deassertion of the signal RAS, in the course of each memory read cycle which is activated.

The flip-flops 55, ... 60 are all set (or confirmed to be set if already so) by the signal OE and each of them is reset by the transition to logic level 0 respectively of the signals RAS 0, 1, 2, 3, 4, 5 received by the expansion support.

Hence, a signal, respectively OE 0, 1, 2, 3, 4, 5 asserted in the course of the two clock periods immediately following the deassertion of the signals RAS 0, 1, 2, 3, 4, 5 respectively, is available at the output Q of the flip-flops.

The signals OE 0, 1, 2, 3, 4, 5 can be used to control the selective enabling of the tridirectional drivers 52, 53, 54 for transfer of the data read to the I/O DAT channel.

The selective enabling of the tridirectional transceivers to transfer data from the I/O DAT channel to the various slots can be controlled by the signals WE 0, 1, 2, 3, 4, 5 when asserted.

It is the task of the memory control unit to restrict occupation of the data channel I/O DAT, with input data, for the period strictly necessary for them to be introduced into the write-instructed DIMM module In this way, bearing in mind that as already stated a column address on the address channel can be removed straight after the assertion of the signal ALE and substituted by a new row address, it becomes possible to instruct the simultaneous operation with partial time overlap of four memory blocks.

It also has the advantage of halving the number of loads connected to the data channel I/O DAT and of sharply separating the various periods in which the modules are enabled to place data on the channel I/O DAT, avoiding any transient interference All of this is achieved without the need for additional control signals on the edge connector of the expansion support.

It is clear that the tridirectional transceivers 52, 53, 54 can each be substituted by a pair of bidirectional drivers (whereby only the advantage of reducing the number of loads connected to the channel I/O DAT is lost) or even by an output multiplexer, with three-state output and six input groups, and by an input demultiplexer, suitably controlled by selection codes extracted from the signals already seen, without the need for additional signals, and hence compatibly with the use of standard connectors with 128 terminals, for inserting DIMM modules.

For completeness of description one last aspect should be considered.

It has already been stated that the DIMM modules output a 10-bit identification code PD(1–10) (for simplicity two Identification bits ID0 and ID1 are incorporated into the code PD) and that by means of this information (read through a dedicated bus known as an I$^2$CBUS) the configuration logic is able to define the configuration to be allotted to memory.

This is true in the case of DIMM modules installed directly in the slots 13, 14, 15, 16 (FIG. 3) of the motherboard.

When, on the other hand, the DIMM modules are installed on an expansion support, other information is transferred to the memory control unit, in particular (FIG. 4):

a code PDX(1–4) which is the OR of codes PD which identify the capacity of each of the memory modules installed on the expansion support, and a plurality of signals PD 5, ... 10 each of which identifies the presence or otherwise of a memory module in one of the six slots of the expansion support.

In this case, identification of the capacity of the individual memory modules is achieved by iterative write and read procedures which are known per se and described for example in European patent EP-0108346.

The availability of the information mentioned above makes it possible to simplify these operations so that memory configuration can take place in very short time scales (a few tens of microseconds) with a reduced number of targeted write and read operations.

It is evident, however, that the data processing system must be able preliminarily to recognize whether the configuration operation has to be executed using one or the other of the two criteria and the meaning of the signals PD81–10).

This information is supplied by the signal RISPRES.

The above description refers to a preferred embodiment and to some of its variants.

It is however evident that many other variants may be introduced.

For example, the signals indicating the presence of the expansion supports can be supplied by connection jumpers at a suitable logic level, arranged on the motherboard, thereby making a certain number of connector terminals available for other purposes, in particular for increasing the maximum level of interleaving.

Similarly, the signals indicating the presence of modules in the slots of the support are not strictly indispensible and serve merely to speed up the configuration procedure. The relevant transfer terminals can therefore, also, be used for other purposes.

What is claimed is:

1. A dynamic random access memory system with expandable capacity, configurable through non-interleaved memory modules or through interleaved memory blocks, said blocks comprising at least one memory module, the dynamic random access memory system comprising:

a motherboard, a memory control unit mounted on said motherboard in order to configure said memory system and to generate, as a function of said memory configuration, of a memory address and of a read/write command received via a system bus, a row address and a column address placed at successive time intervals on an address output channel, a pair of a plurality of distinct timed signals validating row and column addresses respectively, selectively directed to one and only one of said modules, one of a plurality of distinct timed write commands and one of a plurality of distinct latch commands for said column address, selectively directed to one and only one of the said memory blocks, a first plurality of connection slots mounted on said motherboard and interconnected with said memory control unit in order to receive, from said memory control unit, said row and column addresses, said write commands, said latch commands and said plurality of timed signals for validating row and column addresses and, inserted in said slots, one or more memory components of the same type, chosen from the following two types:

memory modules of commercial DIMM type, and expansion supports for memory modules of commercial DIMM type, each expansion slot comprising a printed circuit board with an edge connector for insertion into a slot of said first plurality, a second plurality of connection slots for memory modules of DIMM type, at least one memory module of DIMM type plugged into a slot of the said second plurality and a plurality of latch registers each associated with a slot of said second plurality, each controlled by one of said latch commands for latching said column address received through said edge connector and for presenting it to address terminals of the associated slot.

2. The memory system according to claim 1 in which said supports for memory modules comprise a plurality of drivers with inputs connected to the terminals of said supporting edge connector which receive said row and column address and outputs connected to inputs of said latch registers.

3. The memory system according to claim 1 in which said supports for memory modules comprise a plurality of multidirectional transceiver groups each group being connected to data input/output terminals of at least one of the second plurality of slots and to data input/output terminals of said edge connector, each group being selectively transfer-enabled by a control logic of said supports in response to signals received through said edge connector.

4. The memory system according to claims 1 in which said supports comprise:

an edge connector terminal permanently connected to a logic level 1 source for transferring to said control unit through a slot of said first plurality, a signal indicative of the presence of an expansion support, a first plurality of homologous terminals of said second plurality of slots, the homologous terminals of the said first plurality being connected together and to a terminal of said edge connector, in order to receive and transfer to said control unit a code which is the OR of a plurality of codes, each indicative of the capacity of a memory module installed in one of the slots of said second plurality, and a second plurality of terminals of said edge connector each for receiving and transferring to said control unit a signal indicative of the presence of a memory module installed in a corresponding slot of said second plurality of slots.

5. An expansion support insertable into a connection slot of a first plurality of slots for allowing the interleaved-block configuring of a configurable DRAM memory, controlled by a control unit capable of recognizing the configurability of said memory as interleaved-blocks by recognizing at least one expansion support present in one of the slots of said first plurality of slots, and capable of generating row and column address validation signals directed one-to-one to modules of said memory and column address and write latch commands directed one-to-one to blocks of the said memory, wherein the expansion support comprises:

a printed circuit board with an edge connector for insertion into a slot of said first plurality of slots, a second plurality of connection slots for memory modules of a DIMM type, and a plurality of latch registers each associated with a slot of said second plurality of slots, each latch controlled by one of said latch commands received from said control unit for latching a column address, received from said control unit through said edge connector and for presenting said column address to address terminals of the associated slot of said second plurality of slots, said edge connector having a terminal connected to a signal source of predetermined logic level, for signaling the presence of said expansion support to said control unit.

6. The expansion support according to claim 5, comprising a plurality of drivers with inputs connected to terminals of said edge connector which receive a row address and said column address, and outputs connected to inputs of said latch registers.

7. The expansion support according to claim 5 comprising a plurality of groups of three-state multidirectional drivers each group being connected to data input/output terminals of at least one of said second plurality of slots and to input/output terminals of said edge connector, each group being selectively transfer-enabled by a control logic of said support in response to signals received through said edge connector.

8. The expansion support according to claim 5, in which said second plurality of slots comprises a first plurality of homologous terminals connected together through homologues and to edge connector terminals in order to receive and transfer to said control unit a code which is the OR of a plurality of codes, each indicative of the capacity of a memory module installed in one of the slots of said second plurality and a second plurality of terminals, one for each slot, connected to terminals of said edge connector, in order each to transfer to said control unit a signal indicative of the presence of a memory module installed in a corresponding slot of said second plurality of slots.

* * * * *